(12) United States Patent
Perner et al.

(10) Patent No.: US 9,324,421 B2
(45) Date of Patent: Apr. 26, 2016

(54) METHOD AND CIRCUIT FOR SWITCHING A MEMRISTIVE DEVICE

(75) Inventors: Frederick Perner, Santa Barbara, CA (US); Wei Yi, Mountain View, CA (US); Matthew D. Pickett, San Francisco, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 230 days.

(21) Appl. No.: 13/884,107

(22) PCT Filed: Jan. 31, 2011

(86) PCT No.: PCT/US2011/023250
§ 371 (c)(1),
(2), (4) Date: May 8, 2013

(87) PCT Pub. No.: WO2012/067660
PCT Pub. Date: May 24, 2012

(65) Prior Publication Data
US 2013/0235651 A1  Sep. 12, 2013

Related U.S. Application Data

(60) Provisional application No. 61/415,535, filed on Nov. 19, 2010.

(51) Int. Cl.
*G11C 13/00* (2006.01)

(52) U.S. Cl.
CPC ........ *G11C 13/0002* (2013.01); *G11C 13/0007* (2013.01); *G11C 13/0064* (2013.01); *G11C 13/0069* (2013.01); *G11C 2013/0066* (2013.01); *G11C 2013/0073* (2013.01);

(Continued)

(58) Field of Classification Search
CPC ........... G11C 11/5614; G11C 11/5678; G11C 11/5685; G11C 13/00–13/0019
USPC ........... 365/148, 158, 189.05, 189.07, 189.09
See application file for complete search history.

(56) References Cited

U.S. PATENT DOCUMENTS

| 7,436,723 B2 * | 10/2008 | Rinerson et al. ............... 365/209 |
| 7,457,146 B2 * | 11/2008 | Philipp et al. ................. 365/148 |
| 2004/0114444 A1 | 6/2004 | Matsuoka |

(Continued)

FOREIGN PATENT DOCUMENTS

| CN | 1505052 A | 6/2004 |
| CN | 101093723 A | 12/2007 |

(Continued)

OTHER PUBLICATIONS

Mellor, "HP and Hynix to produce the memristor goods by 2013," Oct. 10, 2011, The Register. 3 pages. Retrieved from: http://www.theregister.co.uk/2011/10/10/memristor_in_18_months/.*

(Continued)

*Primary Examiner* — Alexander Sofocleous
*Assistant Examiner* — Alfredo Bermudez Lozada
(74) *Attorney, Agent, or Firm* — Hewlett Packard Enterprise Patent Department (57) ABSTRACT

A method of switching a memristive device applies a current ramp of a selected polarity to the memristive device. The resistance of the device during the current ramp is monitored. When the resistance of the memristive device reaches the target value, the current ramp is removed.

20 Claims, 8 Drawing Sheets

(52) U.S. Cl.
CPC ............... *G11C 2013/0078* (2013.01); *G11C 2211/5624* (2013.01); *G11C 2211/5645* (2013.01); *G11C 2213/15* (2013.01)

(56) References Cited

U.S. PATENT DOCUMENTS

| | | | |
|---|---|---|---|
| 2007/0297221 | A1 | 12/2007 | Philipp et al. |
| 2008/0151601 | A1 | 6/2008 | Kang et al. |
| 2008/0159046 | A1 | 7/2008 | Rinerson et al. |
| 2009/0097304 | A1 | 4/2009 | Choi et al. |
| 2010/0109656 | A1* | 5/2010 | Wang et al. ............... 324/210 |
| 2010/0284213 | A1 | 11/2010 | Savransky et al. |
| 2011/0007554 | A1* | 1/2011 | Kaeriyama et al. ......... 365/148 |

FOREIGN PATENT DOCUMENTS

| | | | |
|---|---|---|---|
| JP | 2004-234707 | A | 8/2004 |
| JP | 2005-101535 | A | 4/2005 |
| KR | 10-2004-0048864 | | 6/2006 |
| KR | 10-0809339 | | 3/2008 |
| TW | 200842877 | A | 11/2008 |

OTHER PUBLICATIONS

PCT International Search Report, Nov. 28, 2011, Application No. PCT/US2011/023250.

English translation (machine-generated) of Abstract from Chinese Patent Publication No. 101093723A [retrieved on Apr. 28, 2015], Retrieved from the Internet: <http://worldwide.espacenet.com/publicationDetails/biblio?DB=worldwide.espacenet.com&II=0&ND=3&adjacent=true&locale=en_EP&FT=D&date=20071226&CC=CN&NR=101093723A&KC=A>, 2 pages.

English translation (machine-generated) of Abstract from Chinese Patent Publication No. 1505052A [retrieved on Apr. 23, 2015], Retrieved from the Internet: <http://worldwide.espacenet.com/publicationDetails/biblio?DB=worldwide.espacenet.com&II=0&ND=3&adjacent=true&locale=en_EP&FT=D&date=20040616&CC=CN&NR=1505052A&KC=A>, 2 pages.

English translation (machine-generated) of Abstract from Taiwan Patent Publication No. 200842377A [retrieved on Apr. 28, 2015], Retrieved from the Internet: <http://worldwide.espacenet.com/publicationDetails/biblio?DB=worldwide.espacenet.com&II=0&ND=3&adjacent=true&locale=en_EP&FT=D&date=2008110&CC=TW&NR=200842877A&KC=A>, 2 pages.

\* cited by examiner

METHOD AND CIRCUIT FOR SWITCHING A MEMRISTIVE DEVICE

CROSS-REFERENCE TO RELATED APPLICATION

This application is a U.S. National Stage Application of and claims priority to International Patent Application No. PCT/US2011/023250, filed on Jan. 31, 2011, and entitled "METHOD AND CIRCUIT FOR SWITCHING A MEMRISTIVE DEVICE," which claims priority to Provisional U.S. Patent Application No. 61/415,535, filed on Nov. 19, 2010 and entitled "FEEDBACK WRITE SCHEME FOR MEMRISTIVE SWITCHING DEVICES."

STATEMENT REGARDING FEDERALLY SPONSORED RESEARCH OR DEVELOPMENT

This invention has been made with government support under Contract No. HR0011-09-3-0001, awarded by Defense Advanced Research Projects Agency. The government has certain rights in the invention.

BACKGROUND

Memristive devices, or memristors, are a new type of switchable devices with an electrically switchable device resistance. Memristive devices are both scientifically and technically interesting, and hold promise for non-volatile memory (NVM) and other fields. For NVM applications, the compatibility with matured CMOS technology requires the memristive devices to work in binary or other digital modes. The resistance value of a memristive device is used to define the binary or other multi-level digital states. Switching the memristive device reliably and repeatedly to desired states has been a major challenge. It is frequently observed that applying a voltage write pulse often produces large fluctuations in device resistance that exhibit a lognormal distribution. The wide range of such lognormal distribution of device parameters is a potential hinder for the usability, reliability and longevity of memristive devices.

DETAILED DESCRIPTION

The following description provides a method of switching a bipolar memristive device and the associated control circuitry for such switching. As used herein, a memristive device is a switching device with its resistance representing its switching state, and the resistance depends on the history of the voltage and current applied to the device. The term "bipolar" means that the device can be switched from a low-resistance state ("LRS") to a high-resistance state ("HRS") by applying a switching voltage of one polarity, and from a high-resistance state to a low-resistance state by applying a switching voltage of the opposite polarity.

Figure 1:
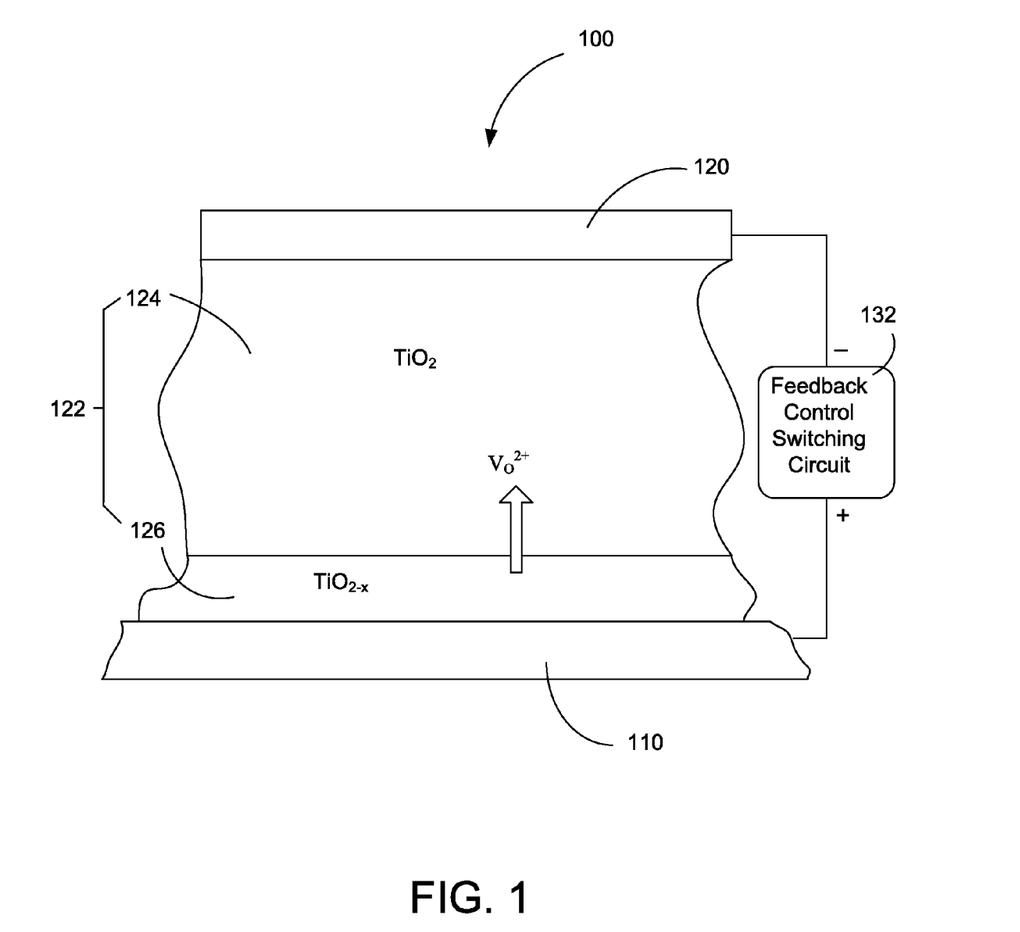
FIG. 1 is a schematic cross-sectional view of an example of a memristive device.

FIG. 1 shows, in a schematic form, an example of a bipolar memristive device 100. In the embodiment shown in FIG. 1, the memristive device is a two-terminal device, with a top electrode 120 and a bottom electrode 110. An active region 122, where the switching behavior takes place, is disposed between the two electrodes. The active region 122 of the switching device 100 includes a switching material that may be electronically semiconducting or nominally insulating, as well as a weak ionic conductor. The switching material contains dopants that may be driven under a sufficiently strong electric field to drift through the switching material, resulting in changes in the resistance of the memristive device. The memristive device 100 can be used, for example, as a non-volatile memory cell, for storing digital information. Such a memory cell may be incorporated into a crossbar structure to provide a high storage capacity.

Many different materials with their respective suitable dopants can be used as the switching material. Materials that exhibit suitable properties for switching include oxides, sulfides, selenides, nitrides, carbides, phosphides, arsenides, chlorides, and bromides of transition and rare earth metals. Suitable switching materials also include elemental semiconductors such as Si and Ge, and compound semiconductors such as III-V and II-VI compound semiconductors. The listing of possible switching materials is not exhaustive and do not restrict the scope of the present invention. The dopant species used to alter the electrical properties of the switching material depends on the particular type of switching material chosen, and may be cations, anions or vacancies, or impurities as electron donors or acceptors. For instance, in the case of transition metal oxides such as $TiO_2$, the dopant species may be oxygen vacancies. For GaN, the dopant species may be nitride vacancies or sulfide ions. For compound semiconductors, the dopants may be n-type or p-type impurities.

By way of example, as shown in FIG. 1, in one embodiment the switching material may be $TiO_2$. In this case, the dopants that may be carried by and transported through the switching material are oxygen vacancies ($V_o^{2+}$). The nanoscale switching device 100 can be switched between ON and OFF states by controlling the concentration and distribution of the oxygen vacancies in the switching material in the active region 122. When a DC switching voltage is applied across the top and bottom electrodes 110 and 120, an electric field is created across the active region 122. The switching voltage and current may be supplied by a switching circuit 132 with closed-loop feedback control, as will be described in greater detail below. The electric field across the active region 122, if of a sufficient strength and proper polarity, may drive the oxygen vacancies to drift through the switching material towards the top electrode 120, thereby turning the device into an ON state.

If the polarity of the electric field is reversed, the dopants may drift in an opposite direction across the switching material and away from the top electrode 120, thereby turning the device into an OFF state. In this way, the switching is reversible and may be repeated. Due to the relatively large electric field needed to cause dopant drifting, after the switching voltage is removed, the locations of the dopants remain stable in the switching material. The switching is bipolar in that voltages of opposite polarities are used to switch the device on and off. The state of the switching device 100 may be read by applying a read voltage to the bottom and top electrodes 110 and 120 to sense the resistance across these two electrodes. The read voltage is typically much lower than the threshold voltage required to induce drifting of the ionic dopants between the top and bottom electrodes, so that the read operation does not alter the resistance state of the switching device.

In the embodiment of FIG. 1, the active region 122 of the switching device has two sub-regions or layers: a primary region 124 and a secondary region 126. The primary region 124 is the main place where the switching behavior occurs. In the originally formed state of the device, the primary region 124 has a relatively low dopant concentration, while the secondary region 126 has a relatively high dopant level. The secondary region 126 functions as a dopant source/drain. During a switching operation, dopants may be driven from the secondary region 126 into the primary region 124, or from the primary region to the secondary region, to change the distribution of dopants in the primary region, thereby changing the conductivity across the primary region.

For instance, the primary region 124 may contain $TiO_2$ with initially very low oxygen deficiency (i.e., low oxygen vacancies), and the second region 126 may be formed with a titanium oxide material ($TiO_{2-x}$) that is stoichiometrically close to $TiO_2$ but with a high level of oxygen vacancies. The top electrode 120 may be formed of a metal, such as platinum (Pt), that does not react with the switching material. The bottom electrode may be formed of a different conductor, such as a mixture of Pt and Ti. The interface of the Pt top electrode 120 with the $TiO_2$ switching material in the primary region 124 generates a Schottky-type depletion region. The interface between the dopant-rich material in the secondary region 126 and the bottom electrode 110, in contrast, may form an Ohmic-type contact. Initially, with a low dopant level in the switching material of the primary region, the height and width of the Schottky-type barrier in the primary region 124 may be large, making it difficult for electrons to tunnel through. As a result, the device has a relatively high resistance. When a switching voltage to turn the device ON is applied, the oxygen vacancies may drift from the secondary region 126 into the primary region and towards the top electrode 120. The increased concentration of dopants in the primary region and/or altered distribution can significantly reduce the height and/or width of the Schotty-type barrier. As a result, electrons can tunnel through the interface much more easily, resulting in a significantly reduced overall resistance of the switching device.

Figure 2:
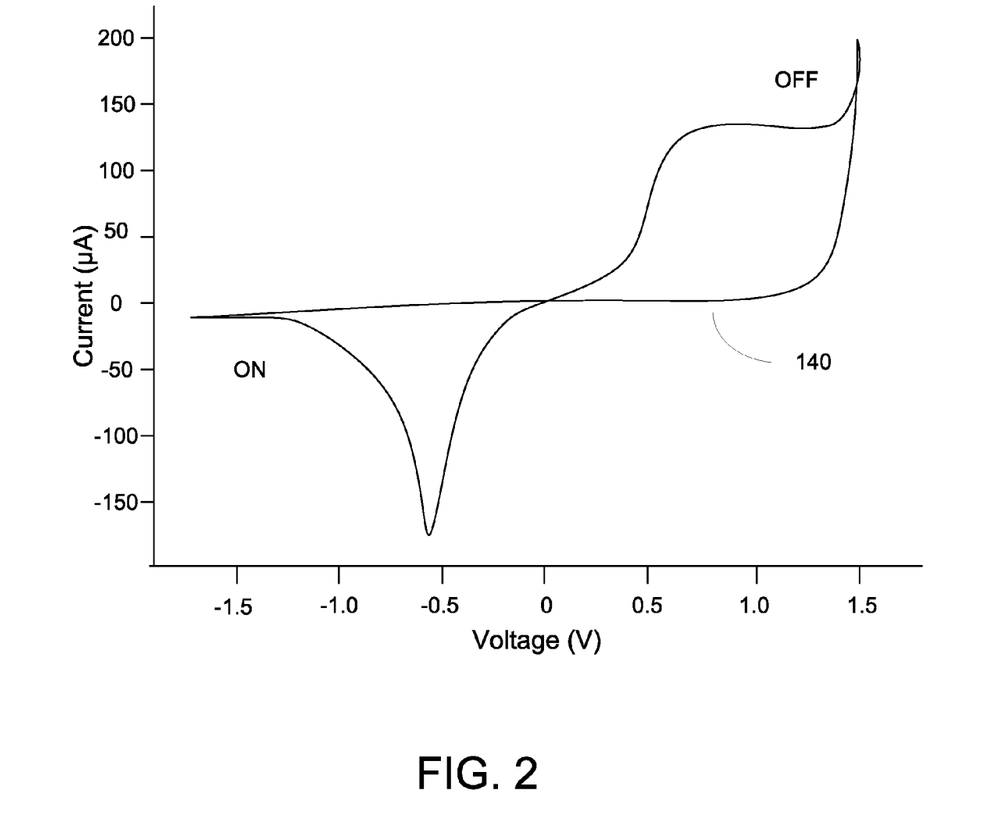
FIG. 2 is an example of a switching I-V curve of a memristive device.

As mentioned above, the resistive state of a bipolar memristive device may be changed by applying a switching voltage, and the resultant resistive state depends on the history of the switching. As an example, FIG. 2 shows a switching I-V curve of a $TiPt/TiO_2/Pt$ switching device with the device junction size of 50×50 $nm^2$. The switching trace 140 was acquired by sweeping the external bias with a preset compliance current ($I_{comp}$) level. The switching polarity is such that a negative bias applied to the top electrode switches the device from a high-resistance state to a low-resistance state (i.e., ON-switching); while a positive bias switches the device from LRS to HRS (i.e., OFF-switching). Hence a bipolar round-trip voltage sweep of $0 \rightarrow -V \rightarrow 0 \rightarrow +V \rightarrow 0$ forms a complete switching cycle that presumably should return the device to its original state. The switching cycle in FIG. 2 was obtained with the $I_{comp}$ set at 175/200 μA for ON/OFF switching respectively. The final resistance value of the device is the slope of the I-V curve at the V=0.

The application of a voltage sweep with a current compliance has traditionally been used as a means for controlling the switching of a memristive device. The I-V curve and the final resistance obtained depend on the level of $I_{comp}$. Higher $I_{comp}$ in an ON-switching will switch the device to more conductive state. While it is convenient to use $I_{comp}$ as a way of switching control, that approach is not universally applicable.

Figure 3:
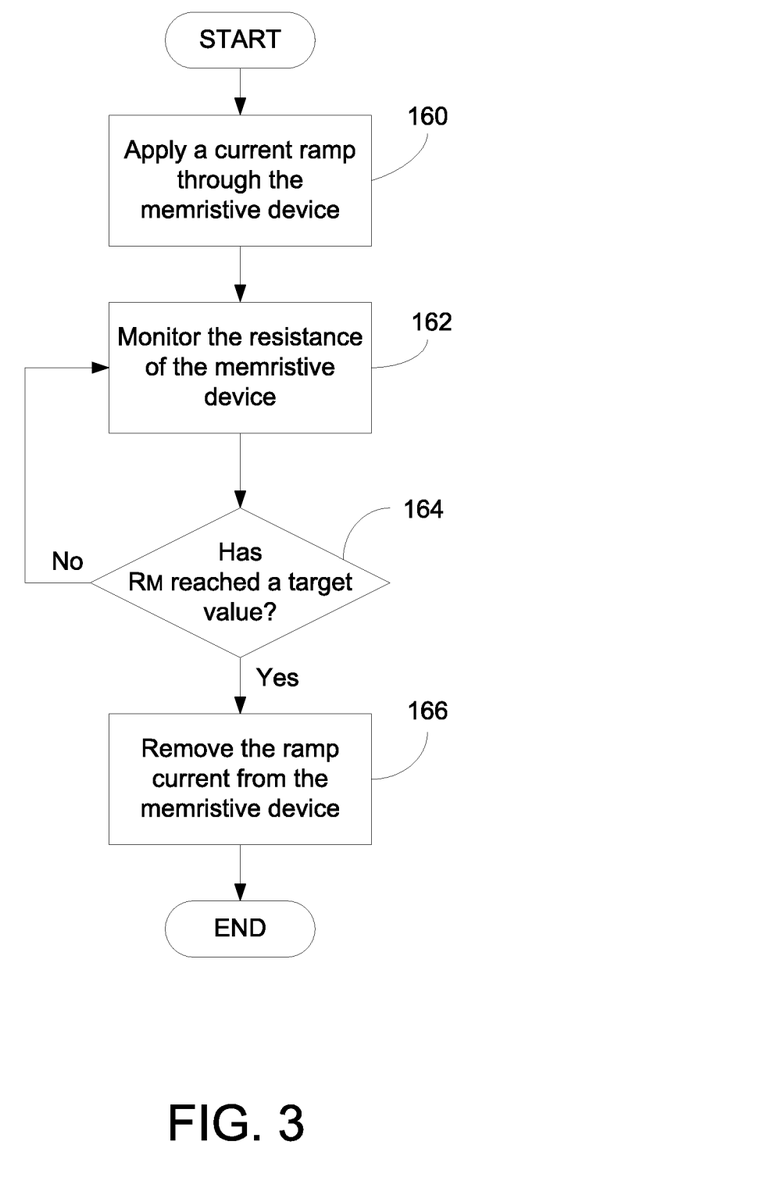
FIG. 3 is a flowchart showing a process of switching a memristive device to a desired resistance value under a closed-loop feedback control.

To provide improved control over the switching process to obtain a much narrower distribution of the resultant resistance value, a method utilizing closed-loop feedback control is provided. FIG. 3 shows a method of switching in accordance with an embodiment the invention. In this method, a current ramp is applied to flow through the memristive device being switched (step 160). The polarity of the current ramp determines whether the memristive device is being switched to a lower or higher resistance state. During the current ramp, the resistance of the memristive device ($R_M$) is monitored (step 162) and compared to a target resistance value. When the resistance reaches the target resistance value (step 164), the current ramp is removed from the memristive device (step 166), thereby setting the resistance state of the device. This process can be used to switch the device from a lower resistance to a higher resistance, or vice versa, or be repeated with the same switching voltage polarity to set the device to different consecutive resistance values. The current ramp rate may be engineered as linear or nonlinear function of time, e.g. logarithmic, to minimize the overshoot of resistance value in switching.

Figure 4:
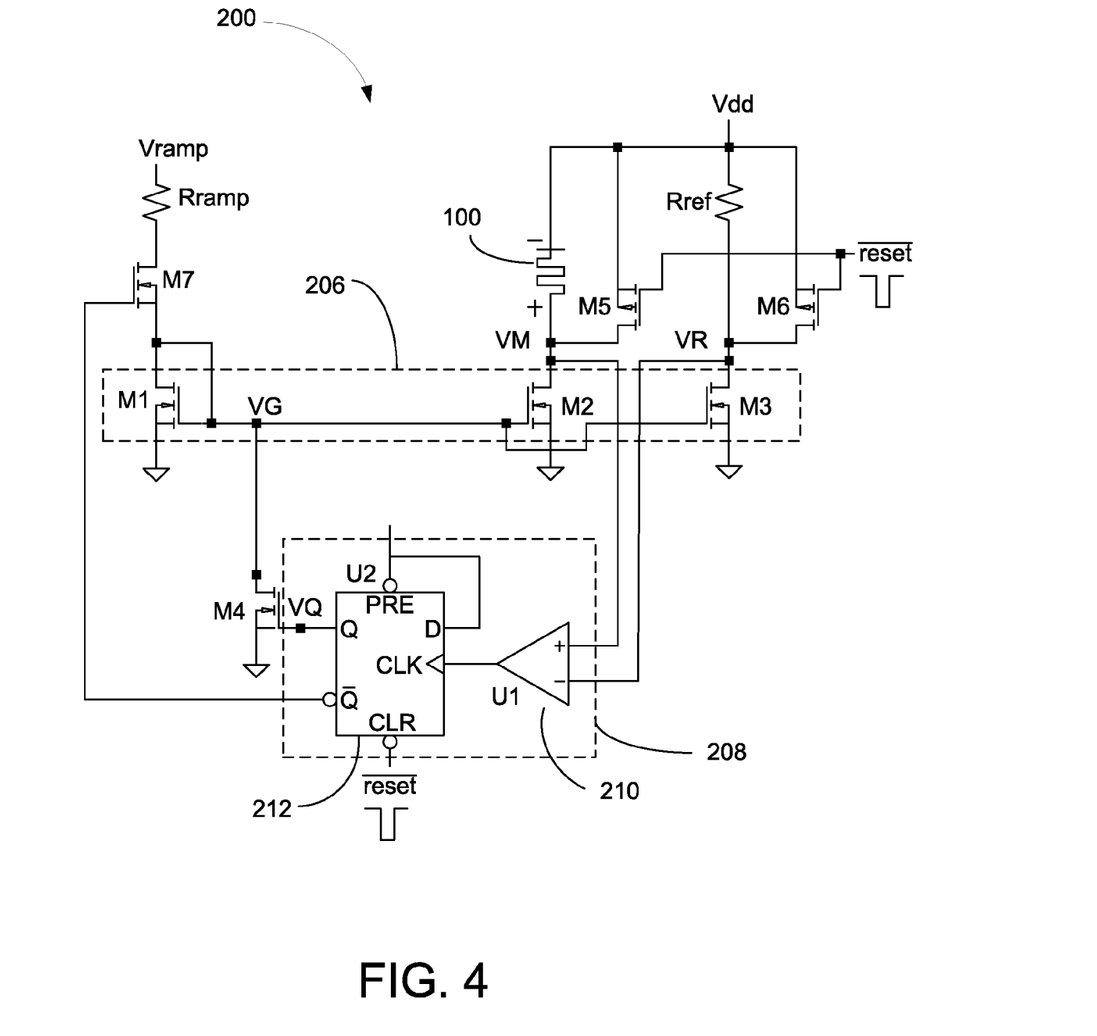
FIG. 4 is a schematic circuit diagram of a closed-loop switching circuit for switching a memristive device from a high-resistance state to a low-resistance state.

By way of example, FIG. 4 shows an analog feedback circuit 200 implementing the closed-loop method for turning a memristive device from a high-resistance state (HRS) to a low-resistance state (LRS), i.e. the ON switching. The circuit 200 has a voltage source which generates a voltage ramp ($V_{ramp}$). The voltage ramp is converted to a current ramp via a conversion resistor $R_{ramp}$ and a transistor M1. The slope of the current ramp is a function of the value of $R_{ramp}$ and the slope of the voltage ramp. The transistor M1 is a master in a current mirror 206, which is a current driver component of the switching circuit. The current mirror 206 has duplicated current output, implemented with two slave transistors M2 and M3. The current flowing through the master transistor M1 is mirrored by the currents flowing through the slave transistors M2 and M3. The slave transistor M2 is connected to the memristive device 100, while the other slave transistor M3 is connected to a reference resistor $R_{ref}$. This arrangement allows the same current ramp (in duplicated form) to be applied simultaneously and in parallel to both the memristive device 100 being switched and the reference resistor $R_{ref}$. The value of the reference resistor $R_{ref}$ is selected to be the target value to which the memristive device 100 is to be set.

The resistance value of the memristive device 100 during the current ramp is monitored. To that end, the voltage drop across the memristive device 100 is used as an indicator of the resistance value. The voltage drop across the memristive device 100 is compared with the voltage drop across the reference resistor $R_{ref}$. In the circuit of FIG. 4, the former is represented by the voltage $V_M$ at the bottom lead of the memristive device 100, and the latter is represented by the voltage $V_R$ at the bottom lead of the reference resistor $R_{ref}$. These two voltages are fed to a latched comparator 208, which serves as a control component of the switching circuit 200. In the embodiment of FIG. 4, the latched comparator 208 is a combination of a high-speed differential-input voltage comparator 210 and a D flip-flop 212 which provides the latching function.

Figure 5:
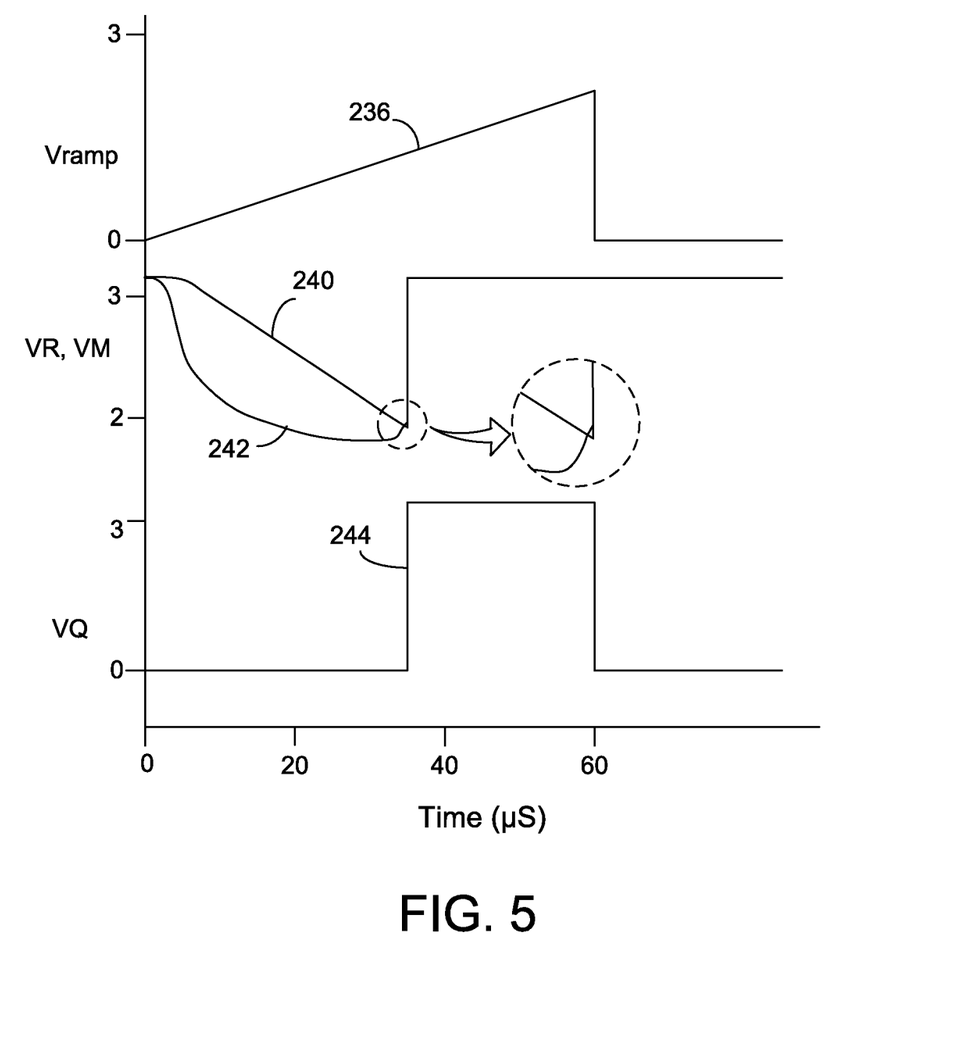
FIG. 5 is a schematic diagram showing voltage waveforms of a memristive device being switched and selected components of the switching circuit of FIG. 4.

FIG. 5 shows the waveforms 236, 240, 242, 244 of $V_{ramp}$, $V_R$, $V_M$, and the output ($V_Q$ in FIG. 4) of the latched comparator 208, respectively. Prior to the ON switching, the memristive device 100 is in a high resistance state, and its resistance is higher than the resistance of the reference resistor $R_{ref}$. After the onset of the current ramp, the waveform 240 of the reference resistor voltage $V_R$ follows (in an inverted way) the shape of the voltage ramp, as the reference resistor has a fixed resistance. In contrast, the waveform 242 of the voltage $V_M$ initially starts with a steeper slope, due to the higher initial resistance of the memristive device 100. As the magnitude of the ramping current increases, however, dopant drifting starts to occur, and the resistance of the memristive device starts to decrease. Since the memristive device has nonlinear I-V characteristics and is more resistive at lower bias, $V_M$ progresses in a highly curved manner. The resistance drop can happen rapidly, faster than the ramping rate of the current, causing the voltage drop across the device to decrease suddenly. This is shown in the waveform 242 of $V_M$ as an inflection. When the resistance of the memristive device drops to the value of the reference resistor, $V_M$ becomes the same as $V_R$. This is the point where the waveform 242 of $V_M$ crosses the waveform 240 of $V_R$. As a result, the differential input of the comparator 210, $V_M$–$V_R$, crosses zero to positive sign and trips the output of the comparator 210 from logic low to logic high. The comparator output is connected via the D flip-flop 212 to the gate of a shunt transistor M4. The latch output ($V_Q$) maintains that logic high and switches on the shunt transistor M4, which effectively bypasses the ramp current flowing through M1 and clamps the mirror transistor gate voltage ($V_G$) back to zero. Consequently the current mirror output transistors (M2 and M3) are switched off and the current ramp through the memristive device 100 and the reference resistor $R_{ref}$ are terminated, even though $V_{ramp}$ could be still rising.

Figure 6:
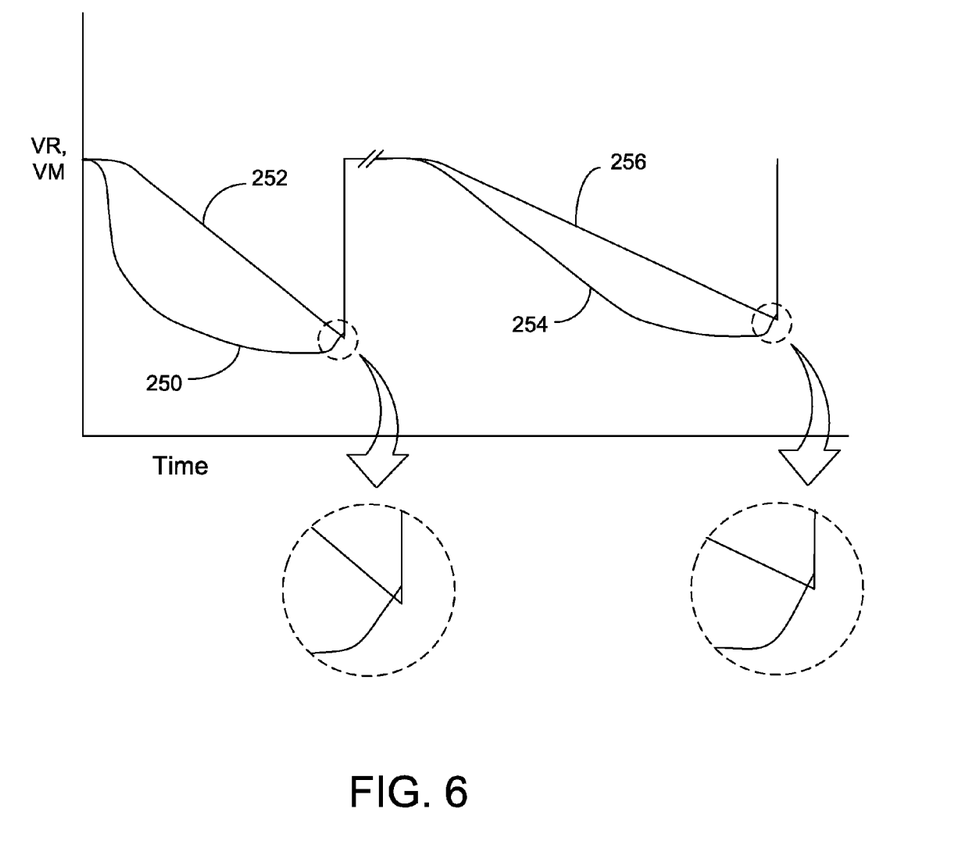
FIG. 6 is a schematic diagram showing voltage waveforms of consecutive switching operations of a memristive device to two different resistance values.

The feedback-controlled switching process can be applied multiple times to set the resistance of the memristive device to different target values, by using different reference resistors of different values. As an example, FIG. 6 shows the waveforms 250, 254 of the voltage $V_M$ in two consecutive switching operations. In this example, for illustration purposes, the same current ramp rate and polarity is used in both operations. In the first switching operation, the device starts with a high resistance value, and a reference resistor of a first target value is used. The voltage drop across the memristive device is represented by the first waveform 250. When the resistance of the device reaches that of the first reference resistor, as indicated by the crossing of the waveform 250 over the voltage waveform of the reference resistor 252, the ramp current is turned off. Thereafter, in the second switching operation, a second reference resistor with a smaller value than the first reference resistor value is used to provide the target value. This is shown as the smaller slope of the waveform 256 of the voltage drop across the second reference resistor as compared to the waveform 252. The memristive device starts with a resistance value that is close to the first target value. As the ramp current increases, the resistance of the memristive device drops further, until it reaches the second target value, as indicated by the crossing of the waveform 254 of the device voltage over the waveform 256 of the second reference resistor. The current ramp is removed at that point, to maintain the resistance of the device at or very close to the second target value. In this way, the memristive device can be set to different resistive states in a controlled manner with small deviations, making it suitable for multi-level logic operations.

Referring back to FIG. 4, to make the feedback circuit more effective, considerations should be taken to reduce the overall response time, i.e. the time delay between the instant that the memristive device reaches the target value and the instant that the current ramp is terminated. The bandwidth and propagation delay of the comparator is desired to be the shortest possible at allowable power consumption budget. The shunt transistor (M4) is designed to bypass the current ramp rather than turning off the voltage ramp sourced from the external circuitry. This way helps in avoiding additional time delay. For this purpose, the shunt transistor (M4) as well as the output transistors in the current mirror (M2 and M3) are preferably fast switching MOSFETs with minimal node capacitance. Accordingly, n-channel MOSFETs may be preferred than their p-channel counterparts for higher mobility and smaller node capacitance.

Also, latched comparator output stage is considered useful. Without a latched output stage that maintains the comparator output level after been tripped, the feedback circuit may possibly run into oscillation. This is due to the fact that once the current ramp is terminated, the voltage drop across the memristive device and $R_{ref}$ will disappear, flipping the polarity of the comparator differential input signal, and turning the comparator output back to logic low. Since the voltage ramp may still be running up, the mirror output transistors (M2 and M3) will be turned on again to continue the current ramp. After the memristive device is written, the comparator is reinitialized to get ready for the next write operation. This is realized by a reset signal to reset the comparator latched output to logic low, and two reset transistors (M5 and M6) that set up a proper initial polarity of the comparator differential input.

To further reduce the power consumption, another n-channel transistor M7 can be placed in between $R_{ramp}$ and the mirror master transistor M1. The gate of this transistor M7 is controlled by the $\overline{Q}$ output of the latch 212. When the memristive device is switched to the ON state, the current ramp through M1 is physically turned off rather than being shunted through M4 to ground. The circuit footprint is also reduced because the channel width of M4 does not need to be larger than M1.

It should be noted that the design of an analog feedback circuit for switching a memristive device is not exclusive and is not limited to the presented example in FIG. 4. For example, the simple current mirror is not an ideal current source. To improve its characteristics such as output impedance or voltage swing range, more advanced current mirror variants can be applied, such as cascode, wide-swing cascode, or gain boosted current mirrors incorporating operational amplifiers. The expense of such advanced current mirrors is the extra footprint and power consumption.

Figure 7:
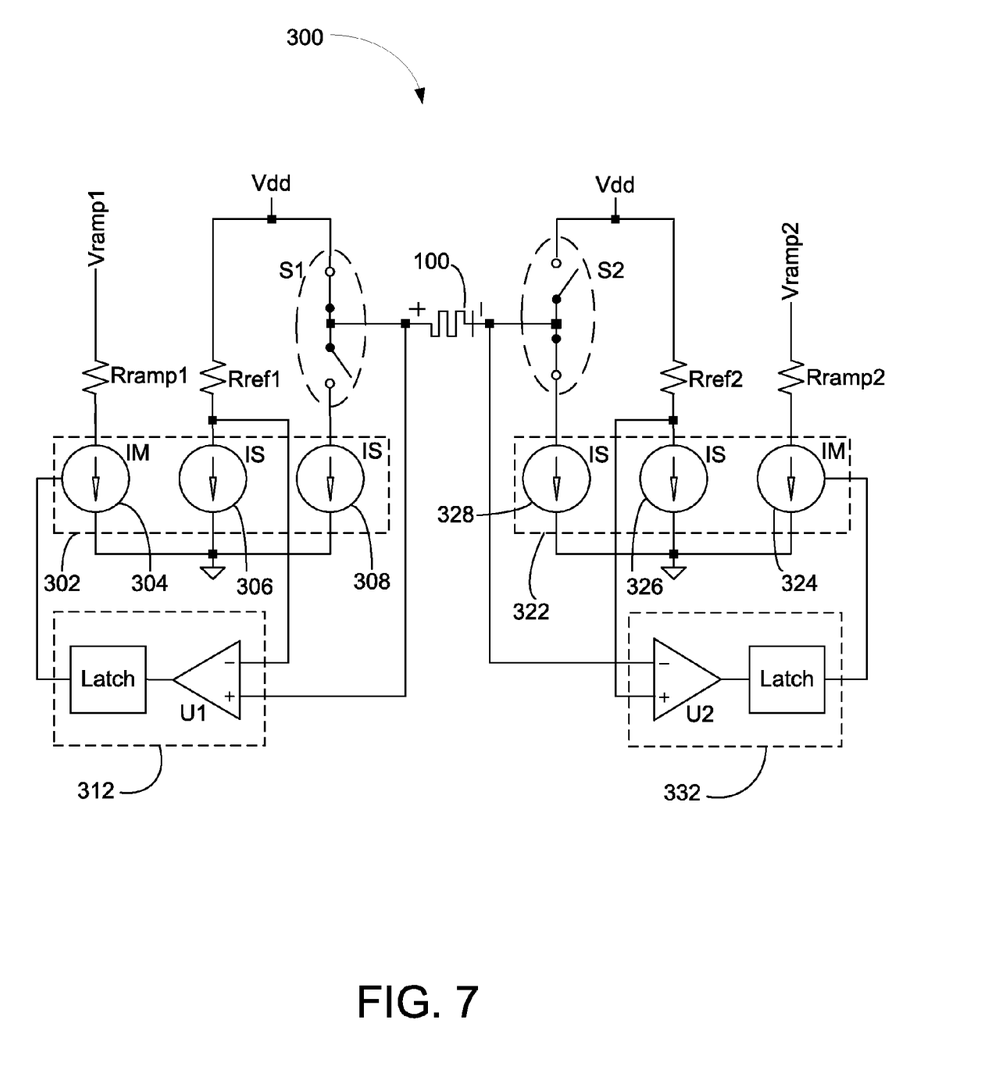
FIG. 7 is a schematic circuit diagram of a closed-loop switching circuit for bipolar switching of a memristive device in a floating configuration.
Figure 8:
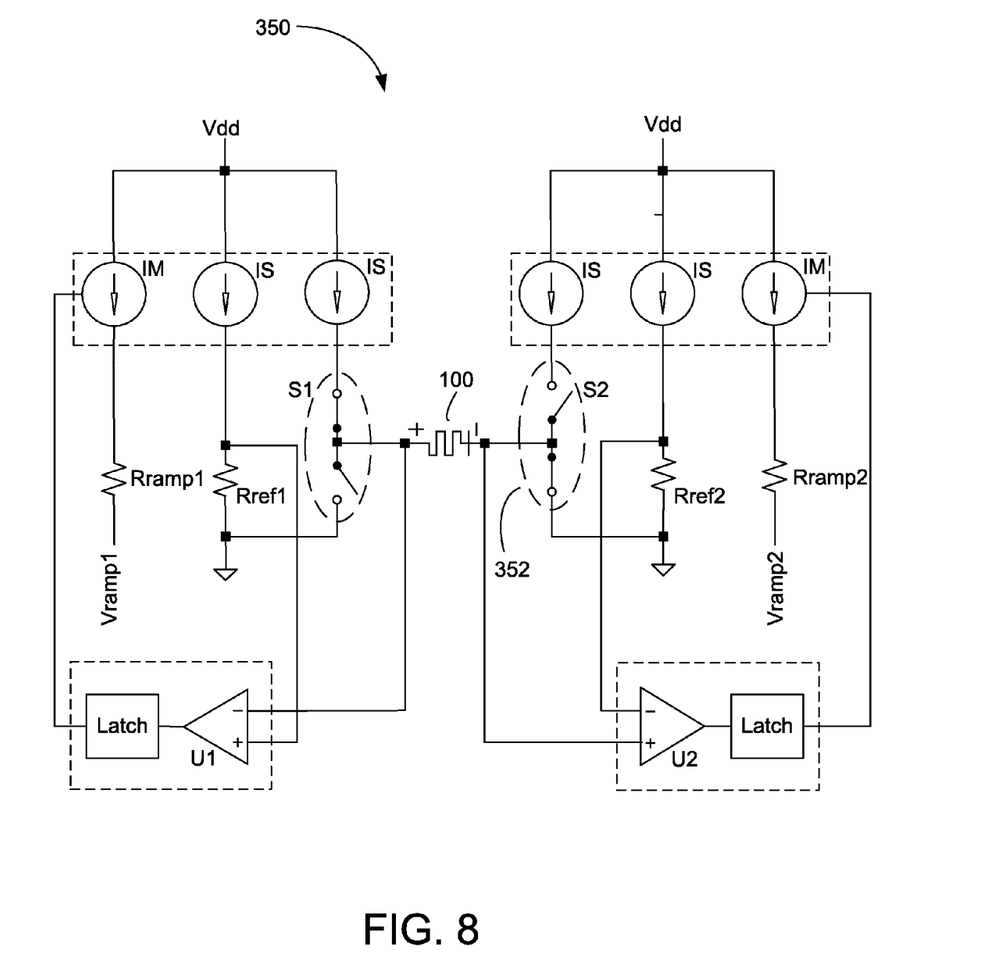
FIG. 8 is a schematic circuit diagram of a closed-loop switching circuit for bipolar switching of a memristive device in a grounding configuration.

It should also be noted that in the circuit in FIG. 4 the switching current flows through the memristive device in only one direction. This is because the circuit is only for switching the memristive device from a high-resistance state to a low-resistance state. For bipolar switching memristive devices, bi-directional current flows through the memristive device are to be realized. FIGS. 7 and 8 show two embodiments of switching circuits for bipolar switching. Both embodiments utilize an "H-bridge" design, which the memristive device bridges two or more current mirrors serving as the feedback driver for SET/RESET operation.

Turning first to FIG. 7, the control circuit 300 has two current mirrors 302 and 322. Each current mirror includes a master driver and two slave drivers. On the left-hand half of the switching circuit, a voltage ramp $V_{ramp1}$ is applied to a conversion resistor $R_{ramp1}$ to generate a current ramp through the master driver 304 of the current mirror 302, and the current ramp is duplicated by the slave drivers 306, 308. One slave driver 306 is connected to a first reference resistor $R_{ref1}$, the value of which may be selected as the target value for an ON-switching operation. The other slave driver 308 is connected to one end of the memristive device 100 through a switch S1. The right-hand half of the H-bridge switching circuit includes the current mirror 322. A second ramp voltage, $V_{ramp2}$, is converted to a current ramp by the conversion resistor $R_{ramp2}$. The ramp current goes through the master driver 324 of the current mirror 322, and is duplicated by the slave drivers 326, 328. The slave driver 326 is connected to a reference resistor $R_{ref2}$, the resistance of which may be selected to provide a target resistance of an OFF state of the memristive device 100. The other slave driver 328 is connected to the second end of the memristive device, which is connected to the supply voltage Vdd via a switch S2.

The switches S1 and S2 may be implemented as CMOS devices and together form an inverter for controlling the direction of current flow through the memristive device 100. To switch the memristive device 100 from a high resistance state (HRS) to low resistance state (LRS), the voltage ramp $V_{ramp1}$ is applied, and the switches S1 and S2 are set such that the ramp current sourced by the slave driver 308 flows through the memristive device 100 in the ON-switching direction. The latched comparator 312 cuts off the ramp current when the memristive device reaches the value of the reference resistor $R_{ref1}$. To switch the memristive device from a low-resistance state (LRS) to a high-resistance state (HRS), the voltage ramp $V_{ramp2}$ is applied. The switches S1 and S2 are set such that the ramp current sourced by the slave driver 328 flows through the memristive device in the OFF-switching direction. When the resistance of the memristive device reaches that of the reference resistor $R_{ref2}$, the latched comparator 332 turns off the current ramp.

FIG. 8 shows another H-bridge switching circuit 350. The circuit 350 is similar to the circuit 300 in FIG. 7, but with the memristive device 100 in a grounded configuration. Specifically, one end of the memristive device 100 is connected to the ground via the switch S1, while the other end of the device is connected to the circuit ground via a resistor 352. In contrast, the memristive device 100 in the circuit 300 is in a floating configuration, with either of the slave drivers 308 or 328 between it and the ground.

As described above, a closed-loop feedback-controlled process has been provided to control the switching a memristive device to a desired resistive state. Embodiments of electronic circuits for implementing the closed-loop switching process are also provided. The closed-loop switching process effectively enhances the consistency of the resistance values of the memristive device over multiple switching operations.

In the foregoing description, numerous details are set forth to provide an understanding of the present invention. However, it will be understood by those skilled in the art that the present invention may be practiced without these details. While the invention has been disclosed with respect to a limited number of embodiments, those skilled in the art will appreciate numerous modifications and variations therefrom. It is intended that the appended claims cover such modifications and variations as fall within the true spirit and scope of the invention.

What is claimed is:

1. A method of switching a memristive device, comprising:
   applying a first current ramp of a first polarity to the memristive device simultaneously and in parallel to a reference resistor of a first target value;
   monitoring a resistance of the memristive device during the first current ramp; and
   removing the first current ramp when the resistance of the memristive device reaches the first target value by bypassing the first current ramp via a shunt transistor.

2. A method as in claim 1, wherein the step of monitoring includes comparing a voltage across the memristive device with a voltage across the reference resistor.

3. A method as in claim 2, wherein the step of comparing includes feeding the voltage across the memristive device and the voltage across the reference resistor to a latched comparator.

4. A method as in claim 2, wherein the steps of applying the current ramp to the memristive device and the reference resistor include driving a current mirror with the current ramp and feeding output currents of the current mirror to the memristive device and the reference resistor.

5. A method as in claim 1, further including:
   applying a second current ramp to the memristive device;
   monitoring the resistance of the memristive device during the second current ramp;
   removing the second current ramp from the memristive device when the resistance of the memristive device reaches a second resistance value.

6. A method as in claim 5, wherein the second current ramp is of the first polarity.

7. A method as in claim 5, wherein the second current ramp is of a second polarity opposite to the first polarity.

8. A switching circuit for switching a memristive device, comprising:
   a current driver component for passing a current ramp simultaneously and in parallel through the memristive device and a reference resistor of a target value;
   a control component for monitoring a resistance of the memristive device and removing the current ramp from the memristive device when the resistance of the memristive device reaches the target value by bypassing the current ramp with a shunt transistor.

9. A switching circuit as in claim 8, wherein the current driver component includes a current mirror.

10. A switching circuit as in claim 9, wherein the control component includes a reference resistor connected to the current mirror such that an output current of the current mirror duplicating the current ramp passes through the reference resistor.

11. A switching circuit as in claim 10, wherein the control component further includes a latched comparator connected to take a voltage of the memristive device and a voltage of the reference resistor as inputs.

12. A switching circuit as in claim 11, wherein the control component further includes a switch for controlling a flow direction of the current ramp through the memristive device.

13. A switching system for switching a memristive device, comprising:
   a first half and a second half connected by the memristive device to form an H-bridge, the first half including a first current driver component and a first control component, and the second half including a second current driver component and a second control component,
   wherein the first current driver component passes a first current ramp through the memristive device in a first direction, the first control component includes a shunt transistor to bypass the first current ramp from the memristive device when a resistance of the memristive device reaches a first target value, the second current driver component passes a second current ramp through the memristive device in a second direction opposite to the first direction, and the second control component includes a shunt transistor to bypass the second current ramp from the memristive device when the resistance of the memristive device reaches a second target value.

14. A switching circuit as in claim 13, wherein the first half includes a first reference resistor for providing the first target value, and the second half includes a second reference resistor for providing the second target value.

15. A switching circuit as in claim 14, wherein the first and second current driver components each includes a current mirror.

16. The method of claim 5, in which the first target value is a target value for an ON-switching operation, and wherein the step of monitoring includes:

applying the second current ramp simultaneously and in parallel to a second reference resistor of a target value for an OFF-switching operation for the memristive device;

comparing a voltage across the memristive device with a voltage across the second reference resistor.

17. The switching circuit of claim 8, wherein the memristive device comprises an active region with a primary sub-region to receive dopants and a secondary region for supplying dopants to the primary sub-region.

18. The switching circuit of claim 8, wherein the switching circuit is a multi-level logic circuit wherein multiple current drivers pass multiple current ramps through the memristive device and multiple reference resistors.

19. The method of claim 3, wherein the latched comparator comprises a D flip-flop.

20. The switching circuit of claim 11, wherein the latched comparator comprises a D flip-flop.

* * * * *